(12) United States Patent
Lee et al.

(10) Patent No.: US 9,025,913 B2
(45) Date of Patent: May 5, 2015

(54) INTERPOSER FOR OPTICAL MODULE, OPTICAL MODULE USING THE SAME, METHOD FOR MANUFACTURING THE SAME

(75) Inventors: Geon Cheon Lee, Seoul (KR); Hyun Jung Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/111,589

(22) PCT Filed: Apr. 13, 2012

(86) PCT No.: PCT/KR2012/002840
§ 371 (c)(1),
(2), (4) Date: Oct. 17, 2013

(87) PCT Pub. No.: WO2012/141541
PCT Pub. Date: Oct. 18, 2012

(65) Prior Publication Data
US 2014/0037243 A1 Feb. 6, 2014

(30) Foreign Application Priority Data

Apr. 13, 2011 (KR) .................. 10-2011-0034482

(51) Int. Cl.
*G02B 6/12* (2006.01)
*G02B 6/42* (2006.01)
*G02B 6/43* (2006.01)
*H05K 1/02* (2006.01)

(52) U.S. Cl.
CPC .. *G02B 6/12* (2013.01); *G02B 6/42* (2013.01); *G02B 6/428* (2013.01); *G02B 6/43* (2013.01); *H05K 1/0274* (2013.01)

(58) Field of Classification Search
CPC .............................. G02B 6/43; G02B 6/12004
USPC ................................................ 385/14, 88–92
See application file for complete search history.

(56) References Cited

U.S. PATENT DOCUMENTS

| | | | | |
|---|---|---|---|---|
| 5,625,734 | A * | 4/1997 | Thomas et al. ................ | 385/88 |
| 6,850,674 | B2 * | 2/2005 | Haraguchi et al. ............. | 385/49 |
| 7,369,720 | B2 * | 5/2008 | Yokino et al. .................. | 385/14 |
| 7,403,676 | B2 * | 7/2008 | Kurihara et al. ................ | 385/14 |
| 7,622,700 | B2 * | 11/2009 | Ohtorii ...................... | 250/208.2 |

(Continued)

FOREIGN PATENT DOCUMENTS

| KR | 10-2004-0074969 A | 8/2004 |
|---|---|---|
| KR | 10-2006-0050250 A | 5/2006 |
| KR | 10-2010-0092861 A | 8/2010 |

OTHER PUBLICATIONS

International Search Report for International Application No. PCT/KR2012/002840.

(Continued)

*Primary Examiner* — Ellen Kim
(74) *Attorney, Agent, or Firm* — LRK Patent Law Firm

(57) ABSTRACT

An interposer for an optical module includes a first substrate having an optical device mounting part on which an optical device is mounted, and a second substrate including a connection via electrically connected to a terminal pattern of the optical device mounting part. The first and second substrates are coupled with each other while forming a predetermined inclination angle therebetween.

19 Claims, 4 Drawing Sheets

(56) References Cited

U.S. PATENT DOCUMENTS

| | | | |
|---|---|---|---|
| 8,705,906 B2* | 4/2014 | Im et al. ........................ | 385/14 |
| 2004/0218372 A1 | 11/2004 | Hamasaki et al. | |
| 2005/0169639 A1* | 8/2005 | Shen ........................... | 398/164 |
| 2006/0035510 A1 | 2/2006 | Numata et al. | |
| 2006/0078248 A1* | 4/2006 | Sasaki et al. ................. | 385/14 |
| 2008/0247706 A1 | 10/2008 | Dellmann et al. | |
| 2009/0169219 A1 | 7/2009 | Nakano et al. | |
| 2010/0209041 A1 | 8/2010 | Matsushima et al. | |

OTHER PUBLICATIONS

KIPO Notice of Allowance for Korean Patent Application No. 10-2011-0034482 which corresponds to the above-identified U.S. Application.

European Search Report for European Patent Application No. 12770603 which corresponds to the above-identified U.S. Application.

* cited by examiner

INTERPOSER FOR OPTICAL MODULE, OPTICAL MODULE USING THE SAME, METHOD FOR MANUFACTURING THE SAME

TECHNICAL FIELD

The disclosure relates to an interposer for an optical module, an optical module using the same, and a method for manufacturing the same.

BACKGROUND ART

In optical communication, a photoelectric conversion device of a transmitter converts electrical signals into optical signals, and the converted optical signals are transmitted to a receiver through an optical fiber or an optical waveguide. Then, the optical signals, which have been received, are converted into electrical signals in a photoelectric conversion device of the receiver.

In order to apply the photoelectric conversion device to a system for the purpose of commercialization, the photoelectric conversion device requires effective electrical connection and optical connection.

FIG. 1 is a sectional view showing the structure of a photoelectric conversion device according to the related art.

The photoelectric conversion device according to the related art includes a holder 10 to expose one end of an optical waveguide 1 while surrounding the optical waveguide 1, an optical device 20 to receive an optical signal output from the exposed end of the optical waveguide 1 or to output an optical signal to the exposed end of the optical waveguide 1, an interposer 30 having the optical device 20 mounted thereon and a terminal electrically connected to the optical device 20, and a gap maintaining part 50 fixed to the holder 10 and the interposer 30 while being interposed between the holder 10 and the interposer 30 and provided therein with a through hole in which the optical device 20 is placed.

The structure is mounted on a printed circuit board 60, and a driving circuit chip is mounted on the printed circuit board 60. The terminal of the interposer 30 is electrically connected to the driving circuit chip.

Electrical pads 41a, 41b, 43a, and 43b and terminals 51, 52, and 53 are used to connect components to each other.

However, according to a photoelectric conversion module of the related art, in addition to a process of installing the interposer 30 having the optical device 20 mounted thereon and a substrate having the driving circuit chip mounted thereon in the printed circuit board 60, a wire bonding process of electrically connecting the interposer 30 and the substrate is additionally required. Accordingly, light loss may be increased.

DISCLOSURE OF INVENTION

Technical Problem

The embodiment of the disclosure is to provide an optical module in which an optical waveguide can be manufactured separately from an IC substrate, and realized in a flat structure instead of a mirror form by using an interposer having a bending part (having an L shape).

Solution to Problem

According to the embodiment, there is an interposer for an optical module, which includes a first substrate having an optical device mounting part on which an optical device is mounted, and a second substrate including a connection via electrically connected to a terminal pattern of the optical device mounting part. The first and second substrates are coupled with each other while forming a predetermined inclination angle therebetween.

Advantageous Effects of Invention

According to the embodiment of the disclosure, an optical waveguide is manufactured separately from an IC substrate, and realized in a flat structure instead of a mirror form by using an interposer having a bending part (having an L shape), so that the light loss can be minimized.

In particular, according to the embodiment of the disclosure, since the alignment of the optical device and the optical waveguide can be ensured through the butt coupling scheme, the light loss can be significantly reduced as compared with a minor structure according to the related art.

In addition, according to the embodiment of the disclosure, the electrical connection between the IC substrate and the optical device are automatically performed as compared with a surface mount technology of the interposer, so that the reliability for the product can be improved.

Further, in order to mount the optical device on the IC substrate, an additional work or a dedicated jig for the movement of the optical device is not required, so that the manufacturing process can be simplified.

Figure 7:
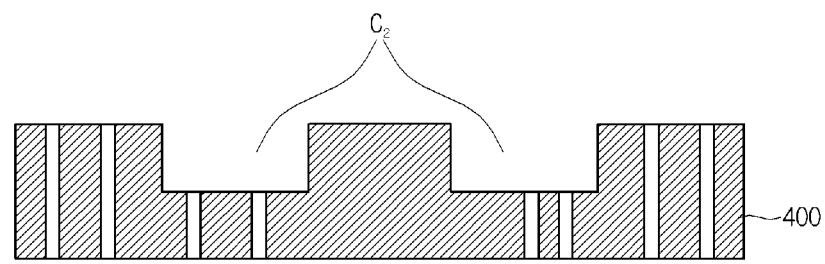
Figure 8:
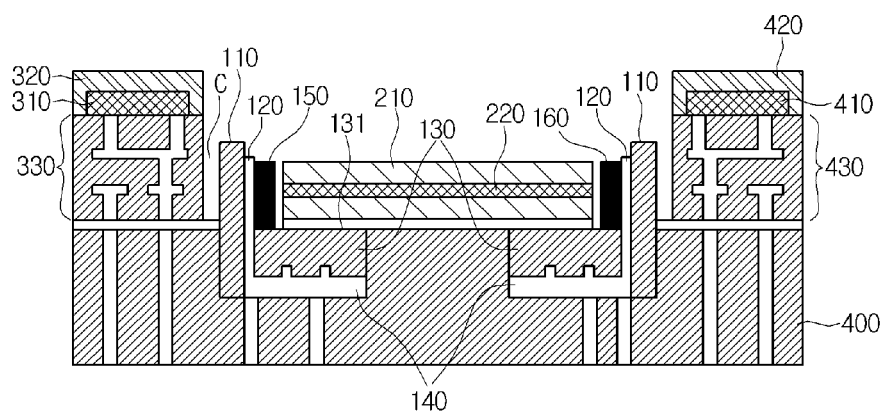
Figure 9:
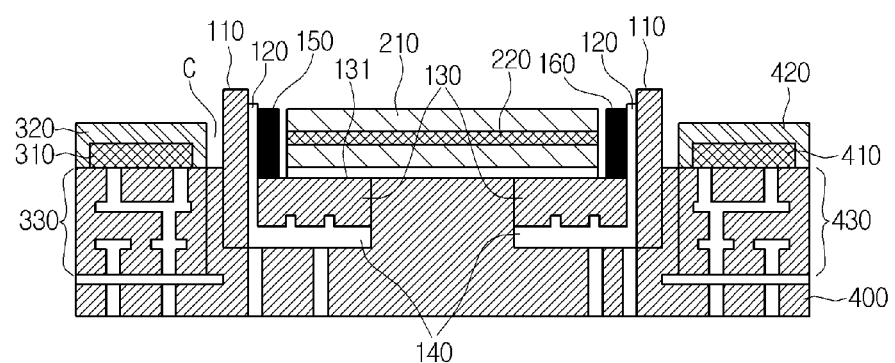
Figure 10:
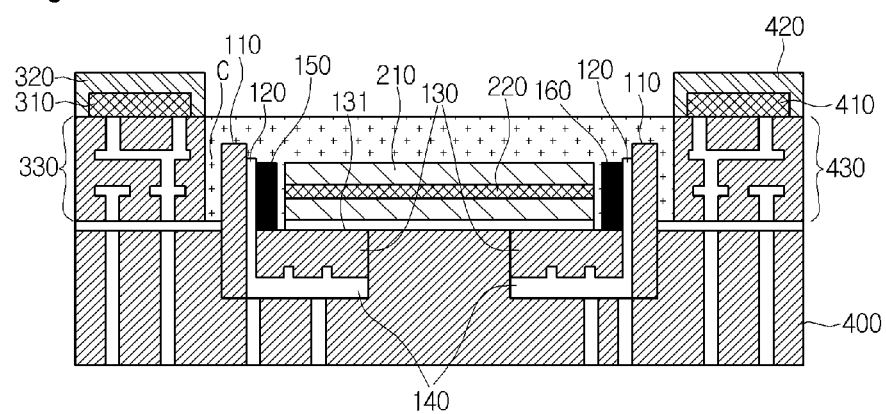

FIG. is a sectional view showing the procedure of forming the optical module according to the embodiment of the disclosure;

FIGS. 7 and 8 are views showing an optical module according to another embodiment of the disclosure;

FIG. 9 is a view showing an optical module according to still another embodiment of the disclosure; and FIG. 10 is a sectional view showing an optical module according to still another embodiment of the disclosure.

MODE FOR THE INVENTION

Hereinafter, the structure and the operation according to the disclosure will be described in detail with reference to accompanying drawings. In the following description based on the accompanying drawings, the same elements will be assigned with the same reference numerals regardless of drawing numbers, and the repetition in the description of the same elements having the same reference numerals will be omitted in order to avoid redundancy. Although the terms "first" and "second" may be used in the description of various elements, the disclosure is not limited thereto. The terms "first" and "second" are used to distinguish one element from the other elements.

1. Embodiment of Manufacturing Process of Interposer for Optical Module

Figure 1:
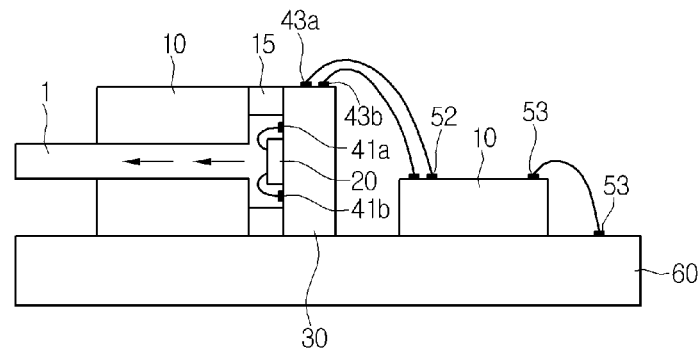
FIG. 1 is a sectional view showing the structure of a photoelectric conversion module according to the related art.
Figure 2:
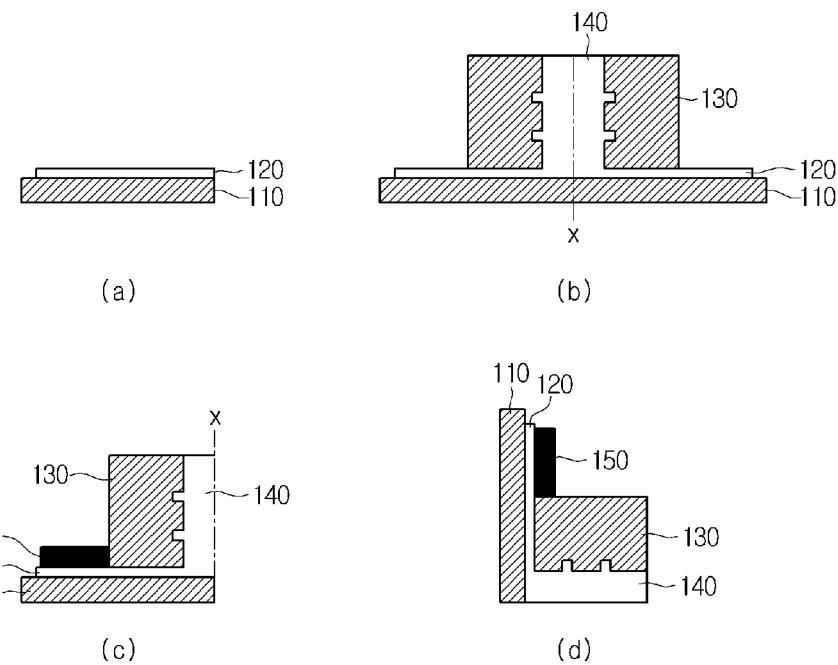
FIG. 2 illustrates views showing the manufacturing process of an interposer according to the disclosure.

FIG. 2 illustrates views showing the manufacturing process of an interposer for an optical module according to the disclosure.

As shown in FIG. 2(a), after forming a metallic layer 120 on a first substrate 110 having an insulating property, the metallic layer 120 is patterned to form a metallic terminal pattern, in which an optical device is installed, in the following process.

The first substrate 110 may include various materials such as polyimide and epoxy-based materials, and the metallic layer 120 may include copper (Cu).

Thereafter, as shown in FIG. 2(b), a second substrate 130 is laminated on the first substrate 110 and the metallic layer 120. Next, after forming a via hole in a central portion of the second substrate 130, a metallic material is filled in the via hole to form a via 140.

In this case, preferably, the height of the connection via 140 can be adjusted by repeating the laminating of the second substrate 130, the forming of the via hole, and the filling of the metallic material at least two times.

Thereafter, as shown in FIG. 2(c), the resultant structure is cut about the connection via 140 so that the first and second substrates 110 and 130 are divided into two parts, thereby forming an interposer according to the disclosure.

In this case, the interposer has an L shape structure in which the first substrate 110 is perpendicular to a terminal of the second substrate 130.

In addition, an optical device 150 may be mounted on the terminal pattern formed by patterning the metallic layer 120.

In the following description, a part, on which the optical device 150 is mounted, is referred to as "optical device mounting part", and the optical device mounting part makes contact with one surface of the second substrate 130.

In addition, the optical device 150 may be one of a light emitting device including a VCSEL (Vertical Cavity Surface Emitting Laser) and a light receiving device including a photodiode.

In particular, the second substrate 130 has a plurality of connection vias 140 formed by perforating the second substrate 130 in a height direction thereof. A portion of the connection via 140 is buried in the second substrate 130, and a portion of the connection via 140 opposite to the buried portion is exposed to the outside of the second substrate 130.

The exposed portion of the connection via 140 is used for electrical connection with a multi-layer printed circuit board thereafter.

In addition, the connection via 140 has an electrical connection structure with the metallic layer 120 for the realization of the terminal pattern.

In this case, although FIG. 2 shows that the first substrate 110 is coupled with the second substrate 130 perpendicularly to the second substrate 130 so that a portion of the terminal pattern is buried in the second substrate 130, and an optical waveguide seating part is formed at a portion of the second substrate 130, the disclosure is not limited thereto.

In other words, although the first substrate 110 is not perpendicular to the second substrate 130, the first substrate 110 is coupled with the second substrate 130 at a predetermined inclination angle according to the lamination schemes and the arrangement of the second substrate 130. Accordingly, the first substrate 110 and the second substrate 130 may form a bending part having a predetermined inclination angle.

Thereafter, when the interposer according to the disclosure is mounted on a printed circuit board, the optical device mounting part is rotated at an angle of 90° as shown in FIG. 2(d), so that the interposer rotated at the angle of 90° may be mounted on the printed circuit board.

2. Structure of Optical Module

Hereinafter, the structure of an optical module employing the interposer according to the disclosure will be described with reference to FIG. 3.

The optical module according to the disclosure has a basic structure in which a cavity C is formed in a typical multi-layer printed circuit board 400, and includes first and second interposers provided in the cavity C in opposition to each other.

In addition, in the shown structure, two interposers are spaced apart from each other in opposition to each other. In this case, as described with reference to FIG. 2, each interposer includes the first substrate 110 in which the optical device 150 is installed and the second substrate 130 electrically connected to the connection via 140 through the terminal pattern formed by patterning the metallic layer 120.

In particular, the second substrate 130 may be provided on one surface thereof with an optical waveguide seating part, and may be coupled with the first substrate 110 while forming an inclination angle with respect to the first substrate 110. Hereinafter, one example in which the first and second substrates 110 and 130 are coupled with each other in an L shape structure having the inclination angle of 90° will be described Meanwhile, a light receiving device 160 is mounted on an opposite interposer.

In this case, optical waveguides 210 and 220 may be provided on an optical waveguide seating part 131 of the second substrate 130 provided in each interposer while forming a flat structure with respect to the surface of the second substrate 130.

An adhesive 230 is coated on the optical waveguide seating part 131, and the optical waveguides 210 and 220 may be seated on the optical waveguide seating part 131 by the adhesive 230.

Figure 3:
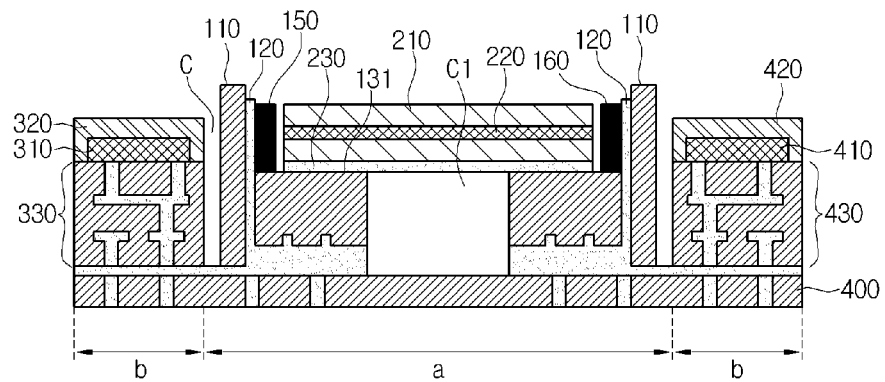
FIG. 3 is a sectional view schematically showing an optical module according to the disclosure.

Although the structure of FIG. 3 includes an empty space C1 formed between the two interposers, when a cavity process is performed so that the space C1 is filled with a predetermined material, the space C1 may serve as a support to support the optical waveguides 210 and 220.

In this case, preferably, the height of a part formed by filling the space C1 with a specific material is equal to a height of the surface of the optical waveguide seating part 131.

In addition, the first and second interposers are provided therein with the connection vias 140 having surfaces exposed to the outside. In this case, the optical module according to the disclosure further includes a driving module 300 electrically connected to the connection vias 140 to drive the optical device 150.

The driving module 300 may include a driver IC 310, a molding part 320, and a substrate 330 to mount the driver IC 310 and the molding part 320 thereon.

In the optical module, various power supplies and data signals are supplied to the driver IC 310 through the printed circuit board 400, and the electrical signal controlled through the driver IC 310 is transmitted to the optical device 150 of the interposer to emit a light.

The light is transferred to the light receiving device 160 through the optical waveguides including the clad 210 and the core 220, and an optical signal received through the light receiving device 160 are transferred to a transimpedance amplifying module so that the optical signal is amplified to an electrical signal.

The transimpedance amplifying module may include a transimpedance amplifier (TIA) 410 and a molding part 420 provided on the printed circuit board 400, and a substrate 430 to mount the TIA 410 thereon.

In this case, a region a of the multi-layer printed circuit board 400 corresponding to the cavity, in which the first and second interposers are installed, may have a flexible property, and regions b of the multi-layer printed circuit board 400 corresponding to regions, in which the driving module and the transimpedance amplifying module are installed, may have a rigid property.

In addition, the multi-layer printed circuit board 400 may be integrally formed with Tx and Rx IC substrates 330 and 430 by using an FPC.

Figure 4:
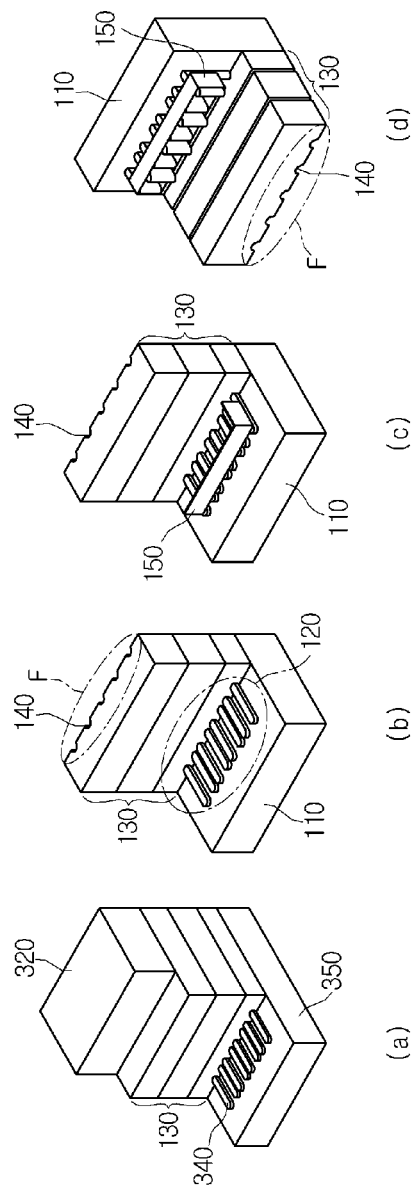
FIG. 4 illustrates views showing the operational state of the optical module according to the disclosure when the structure of the optical module is actually realized.

FIG. 4 is a schematic view showing one example of each component shown in the sectional view of FIG. 3.

FIG. 4(a) shows a driving module actually realized as a Tx module or an Rx module shown in FIG. 3.

In other words, as shown in FIG. 4(a), the molding part 320 is provided to mold the driver IC 310 and the substrate 330 is provided to mount the molding part 320 and the driver IC 310. In addition, an interposer mounting part 340 is provided to mount the interposer thereon in the following process.

In this case, a substrate 350, in which the interposer mounting part 340 is realized, may be a part of the printed circuit board 400.

In other words, the multi-layer printed circuit board of FIG. 3 may be integrally formed with a Tx IC substrate or an Rx IC substrate by using the FPC.

FIG. 4(b) shows the interposer according to the disclosure of FIG. 3, and the interposer has terminal patterns formed by patterning the metallic layer 120.

The interposer includes the first substrate 110 and the second substrate 130 coupled with the first substrate 110 perpendicularly to the first substrate 110, and the connection vias 140 are provided in a rear surface F of the second substrate 130.

FIG. 4(c) shows a result in which the optical device 150 is mounted on the terminal patterns of FIG. 4(b).

FIG. 4(d) shows that the structure of FIG. 4(c) is rotated at an angle of 90° and arranged in the coupling direction with the multi-layer printed circuit board.

Figure 5:
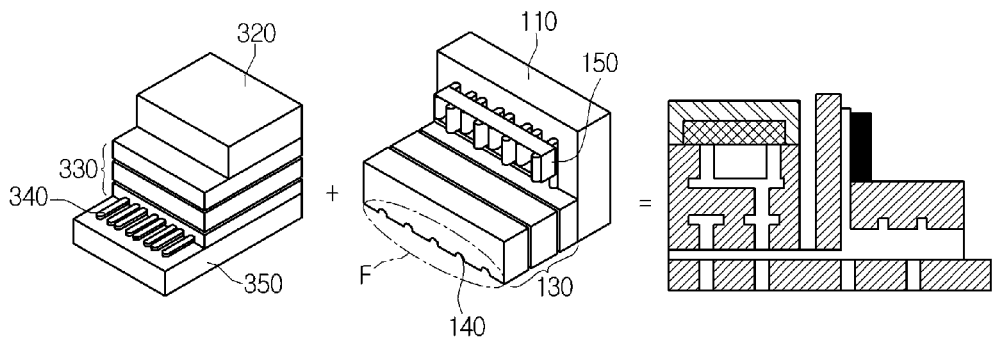
FIG. 5 illustrates views showing the procedure of forming the optical module according to the embodiment of the disclosure.
Figure 6:
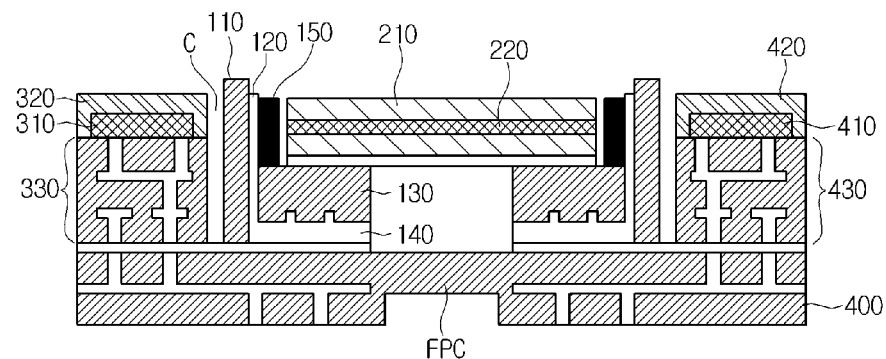

FIGS. 5 and 6 are views showing the procedure of forming the optical module according to the embodiment of the disclosure.

Hereinafter, the typical procedure of forming the optical module will be described.

FIG. 5(a) shows the structure of the Tx/Rx module shown in FIG. 4(a) and a unit region of FIG. 4(c) including the interposer shown in FIG. 4(b).

In other words, according to the disclosure, after coupling the Tx module and the Rx module with the interposers, respectively, the Tx module and the Rx module are aligned on the FPC, and the optical waveguides are installed in the resultant structure as shown in FIG. 6.

In this case, the FPC may be manufactured the form of a multi-layer PI lamination structure, and may be additionally provided during the manufacturing of the Tx/Rx module shown in FIG. 5(a) or after the manufacturing of the Tx/Rx module shown in FIG. 5(a).

FIGS. 7 and 8 are views showing an optical module according to another embodiment of the disclosure.

In other words, as shown in FIGS. 7 and 8, the optical module can be realized in a structure different from that of the optical module shown in FIG. 3.

Referring to FIG. 7, a plurality of second cavities C2 may be previously realized on the multi-layer printed circuit board 400 of a rigid type Next, after burying interposers in the second cavities C2, the optical module shown in FIG. 8 can be manufactured.

In other words, as shown in FIG. 8, a second cavity region C2 is previously realized below the cavity region (first cavity region C) shown in FIG. 4, and a pair of interposers according to the disclosure are installed in the second cavity region C2 while being opposite to each other. In this case, the optical waveguide 220 is horizontally provided in the first cavity region C, and the surface of the second substrate 130 having a buried structure according to the disclosure is exposed in parallel to the bottom surface of the first cavity region, so that the optical waveguide can be realized.

In addition, a portion of the first substrate 110 of the interposer according to the disclosure may be vertically buried in the second cavity region, and another portion of the first substrate 110 may be exposed to the first cavity region. In this case, the optical device 150 is provided on the exposed surface of the first substrate 110.

Besides, the structure in which the driving module and the transimpedance amplifying module (TIA) are provided at both sides of the optical waveguide is the same as that of FIG. 4. In other words, as the Tx/Rx module is provided at an upper portion of the printed circuit board, only the interposer is buried, and the optical waveguide is mounted on the interposer without the air gap.

In addition, a third cavity may be additionally provided so that the driving module and the transimpedance amplifying module TIA according to the disclosure may be buried in the third cavity. In other words, the number of cavities can be added up to two or four.

FIG. 9 is a view showing an optical module according to still another embodiment of the disclosure.

In other words, referring to FIG. 9, if a third cavity region is added to the structure of FIG. 6, an optical module, in which the Tx/Rx module is buried in the third cavity region, can be realized.

Naturally, when a circuit pattern of a Tx/Rx module is realized on a substrate without additionally employing the Tx/Rx module, the structure without the third cavity region may be employed.

FIG. 10 is a sectional view showing an optical module according to still another embodiment of the disclosure.

Referring to FIG. 10, a protective substrate 500 is further provided on the multi-layer printed circuit substrate 400 in the optical module according to the embodiment of the disclosure shown in FIGS. 3, 6, 8, and 9.

The first interposer, the second interposer, and the optical waveguide mounted on the multi-layer circuit substrate 400 are buried in the protective substrate 500.

In other words, the first interposer, the second interposer, and the optical waveguide are buried in the protective substrate 500 so that the first and second interposers and the optical waveguide can be protected from an external condition.

In particular, the protective substrate 500 may be formed on the multi-layer printed circuit board 400 through several processes.

First, a first protective substrate may be formed on the optical waveguide. The first protective substrate may include a material representing high light transmittance to prevent an optical signal from being affected. In addition, the second protective substrate may be formed on the first protective substrate. The second protective substrate may include an insulating material to protect the first protective substrate while being insulated from an external environment.

As described above, as shown in FIG. 10, the protective substrate 500 is additionally formed, so that an embedded optical module can be provided.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

The invention claimed is:

1. An interposer for an optical module, the interposer comprising:
   a first substrate (110) having an optical device mounting part on which an optical device (150) is mounted; and
   a second substrate (130) including a connection via (140) electrically connected to a terminal pattern of the optical device mounting part,
   wherein the first substrate is coupled with the second substrate at a predetermined inclination angle so that the first substrate and the second substrate form a bending part having the predetermined inclination angle.

2. The interposer of claim 1, wherein the second substrate is coupled with the first substrate such that a portion of the terminal pattern is buried in the second substrate and an optical waveguide seating part is formed on the second substrate to mount an optical waveguide thereon.

3. The interposer of claim 2, wherein the connection via is buried in the second substrate such that a portion of a surface of the connection via is exposed to an outside of the second substrate.

4. The interposer of claim 2, wherein the first substrate and the second substrate are perpendicularly coupled to each other.

5. An optical module comprising:
   a multi-layer printed circuit board having a cavity therein; and
   first and second interposers spaced apart from each other by a predetermined distance in the cavity while facing each other,
   wherein each of the first and second interposers comprises:
   a first substrate having an optical device mounted thereon; and
   a second substrate electrically connected to the optical device and provided at one surface thereof with an optical waveguide seating part, and
   wherein the first and second substrates are coupled with each other while forming a predetermined inclination angle therebetween.

6. The optical module of claim 5, wherein an optical waveguide, which transmits optical signal according to the optical device, is arranged in the optical waveguide seating part formed in each of the first and second interposer.

7. The optical module of claim 5,
   wherein the multi-layer printed circuit board comprises a driving module which drives the optical device and is electrically connected to a connection via, and
   wherein the connection via is buried in the second substrate of each of the first and second interposers such that a portion of a surface of the connection via is exposed.

8. The optical module of claim 7, wherein the cavity comprises:
   a first cavity region in which an optical waveguide is arranged; and
   a second cavity region which is formed below the first cavity region and in which the second substrate of each of the first and second interposers and the connection via are buried.

9. The optical module of claim 8, wherein the second substrate is buried in the second cavity region in such a manner that a surface of the second substrate is aligned in parallel to a bottom surface of the first cavity region.

10. The optical module of claim 8, wherein the multi-layer printed circuit board further comprises a transimpedance amplifying module (TIA) electrically connected to the connection via of each of the first and second interposers to amplify an optical signal to an electrical signal.

11. The optical module of claim 10, wherein the cavity further comprises a third cavity region in which the driving module or the transimpedance amplifying module is buried.

12. The optical module of claim 8,
   wherein the multi-layer printed circuit board is divided into a first region in which the first and second interposers are mounted and a second region in which the driving module and the transimpedance amplifying module are mounted, and
   wherein the first region of the multi-layer printed circuit board has a flexible property, and the second region of the multi-layer printed circuit board has a rigid property.

13. The optical module of claim 8, wherein the optical waveguide is aligned in a flat shape on a surface of the optical waveguide seating part of each of the first and second interposers.

14. The optical module of claim 7, wherein the cavity interposed between the first and second interposers is filled with a specific material so that the cavity has a height equal to a height of a surface of the optical waveguide seating part formed in each of the first and second interposers.

15. The optical module of claim 6, further comprising a protective substrate which is formed on the multi-layer printed circuit board, and in which the first and second interposers and the optical waveguide formed on the multi-layer printed circuit board are buried.

16. A method of manufacturing an interposer for an optical module, the method comprising:
   forming a terminal pattern used to mount an optical device on a first substrate;
   laminating a second substrate on the first substrate having the terminal pattern so that the second substrate has a predetermined inclination angle with respect to the first substrate;
   forming a via hole in the second substrate and forming a connection via by filling a conductive material into the via hole; and
   dividing the first and second substrates into a plurality of parts about the connection via.

17. The method of claim 16, wherein the laminating of the second substrate, the forming of the via hole, and the forming of the connection via are repeatedly performed at least two times.

18. The method of claim 16, further comprising mounting an optical device on a surface of the first substrate divided into a plurality of parts.

19. The optical module of claim 5, wherein the optical device is a light emitting device including a VCSEL (Vertical Cavity Surface Emitting Laser) or a light receiving device including a photodiode.

* * * * *